United States Patent
Lin et al.

(10) Patent No.: US 9,355,927 B2
(45) Date of Patent: May 31, 2016

(54) SEMICONDUCTOR PACKAGING AND MANUFACTURING METHOD THEREOF

(71) Applicant: TAIWAN SEMICONDUCTOR MANUFACTURING COMPANY LTD., Hsinchu (TW)

(72) Inventors: Hsiu-Jen Lin, Hsinchu County (TW);
Wen-Hsiung Lu, Taipei County (TW);
Cheng-Ting Chen, Taichung (TW);
Hsuan-Ting Kuo, Taichung (TW);
Wei-Yu Chen, Taipei (TW); Ming-Da Cheng, Hsinchu County (TW);
Chung-Shi Liu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 68 days.

(21) Appl. No.: 14/088,513

(22) Filed: Nov. 25, 2013

(65) Prior Publication Data

US 2015/0145130 A1     May 28, 2015

(51) Int. Cl.
*H01L 23/488*     (2006.01)
*H01L 23/31*      (2006.01)
(Continued)

(52) U.S. Cl.
CPC ...... *H01L 23/3114* (2013.01); *H01L 23/49816* (2013.01); *H01L 23/49838* (2013.01); *H01L 24/03* (2013.01); *H01L 24/05* (2013.01); *H01L 24/11* (2013.01); *H01L 24/13* (2013.01); *H01L 24/16* (2013.01); *H01L 24/73* (2013.01); *H01L 24/81* (2013.01); *H01L 24/92* (2013.01); *H05K 3/34* (2013.01); *H01L 21/563* (2013.01);

(Continued)

(58) Field of Classification Search
CPC ............ H01L 2924/15311; H01L 24/11;
H01L 24/12; H01L 2224/83855; H01L
2224/81815; H01L 2224/11849; H01L
2225/1058; H01L 23/49838; H01L
2224/16227; H01L 2224/12105; H01L
2225/06513; H01L 23/3114
See application file for complete search history.

(56) References Cited

U.S. PATENT DOCUMENTS 5,672,548 A * 9/1997 Culnane et al. ............... 438/118
5,675,889 A   10/1997 Acocella et al.
(Continued)

FOREIGN PATENT DOCUMENTS

| JP | 2007-208056 A | 8/2007 |
| KR | 10-2011-0032492 A | 3/2011 |
| KR | 10-2011-0128120 A | 11/2011 |

OTHER PUBLICATIONS

Office Action issued by Taiwan Intellectual Property Office on Oct. 16, 2015.
(Continued)

*Primary Examiner* — Wael Fahmy
*Assistant Examiner* — Sarah Salerno
(74) *Attorney, Agent, or Firm* — Chun-Ming Shih

(57) ABSTRACT

The present disclosure provides a semiconductor package includes a contact pad, a device external to the contact pad and a solder bump on the contact pad. The device has a conductive contact pad corresponding to the contact pad. The solder bump connects the contact pad with the conductive contact pad. The solder bump comprises a height from a top of the solder bump to the contact pad; and a width which is a widest dimension of the solder bump in a direction perpendicular to the height. A junction portion of the solder bump in proximity to the contact pad comprises an hourglass shape.

20 Claims, 11 Drawing Sheets

(51) Int. Cl.
   *H01L 23/00*   (2006.01)
   *H01L 23/498*  (2006.01)
   *H05K 3/34*    (2006.01)
   *H01L 21/56*   (2006.01)

(52) U.S. Cl.
   CPC ............... *H01L24/02* (2013.01); *H01L 24/14* (2013.01); *H01L 24/29* (2013.01); *H01L 24/32* (2013.01); *H01L 2224/0239* (2013.01); *H01L 2224/02377* (2013.01); *H01L 2224/02379* (2013.01); *H01L 2224/0382* (2013.01); *H01L 2224/0391* (2013.01); *H01L 2224/03829* (2013.01); *H01L 2224/03849* (2013.01); *H01L 2224/0401* (2013.01); *H01L 2224/05024* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05184* (2013.01); *H01L 2224/05568* (2013.01); *H01L 2224/05794* (2013.01); *H01L 2224/05811* (2013.01); *H01L 2224/10125* (2013.01); *H01L 2224/11005* (2013.01); *H01L 2224/119* (2013.01); *H01L 2224/1191* (2013.01); *H01L 2224/11334* (2013.01); *H01L 2224/131* (2013.01); *H01L 2224/13006* (2013.01); *H01L 2224/1312* (2013.01); *H01L 2224/13014* (2013.01); *H01L 2224/13017* (2013.01); *H01L 2224/13022* (2013.01); *H01L 2224/13023* (2013.01); *H01L 2224/13109* (2013.01); *H01L 2224/13111* (2013.01); *H01L 2224/13113* (2013.01); *H01L 2224/13116* (2013.01); *H01L 2224/13117* (2013.01); *H01L 2224/13139* (2013.01); *H01L 2224/13147* (2013.01); *H01L 2224/13155* (2013.01); *H01L 2224/14131* (2013.01); *H01L 2224/16058* (2013.01); *H01L 2224/16145* (2013.01); *H01L 2224/16227* (2013.01); *H01L 2224/2919* (2013.01); *H01L 2224/32058* (2013.01); *H01L 2224/32145* (2013.01); *H01L 2224/32225* (2013.01); *H01L 2224/73104* (2013.01); *H01L 2224/73204* (2013.01); *H01L 2224/812* (2013.01); *H01L 2224/8121* (2013.01); *H01L 2224/8123* (2013.01); *H01L 2224/81191* (2013.01); *H01L 2224/81192* (2013.01); *H01L 2224/81815* (2013.01); *H01L 2224/9212* (2013.01); *H01L 2924/014* (2013.01); *H01L 2924/0105* (2013.01); *H01L 2924/12042* (2013.01); *H01L 2924/15311* (2013.01); *H01L 2924/181* (2013.01); *H01L 2924/20105* (2013.01); *H01L 2924/20106* (2013.01); *H01L 2924/351* (2013.01)

(56) References Cited

U.S. PATENT DOCUMENTS

| | | | |
|---|---|---|---|
| 5,715,144 A * | 2/1998 | Ameen et al. | 361/790 |
| 7,948,085 B2 * | 5/2011 | Shih | H05K 3/243 174/50 |
| 2003/0003624 A1 * | 1/2003 | Farooq et al. | 438/108 |
| 2003/0087475 A1 * | 5/2003 | Sterrett | H01L 24/11 438/109 |
| 2006/0033214 A1 | 2/2006 | Tomono | |
| 2009/0296364 A1 * | 12/2009 | Yamamoto | H01L 21/563 361/820 |
| 2011/0068151 A1 | 3/2011 | Oh et al. | |
| 2011/0285012 A1 | 11/2011 | Yu et al. | |

OTHER PUBLICATIONS

Office action issued by Korean Intellectual Property Office on Mar. 3, 2016.

* cited by examiner

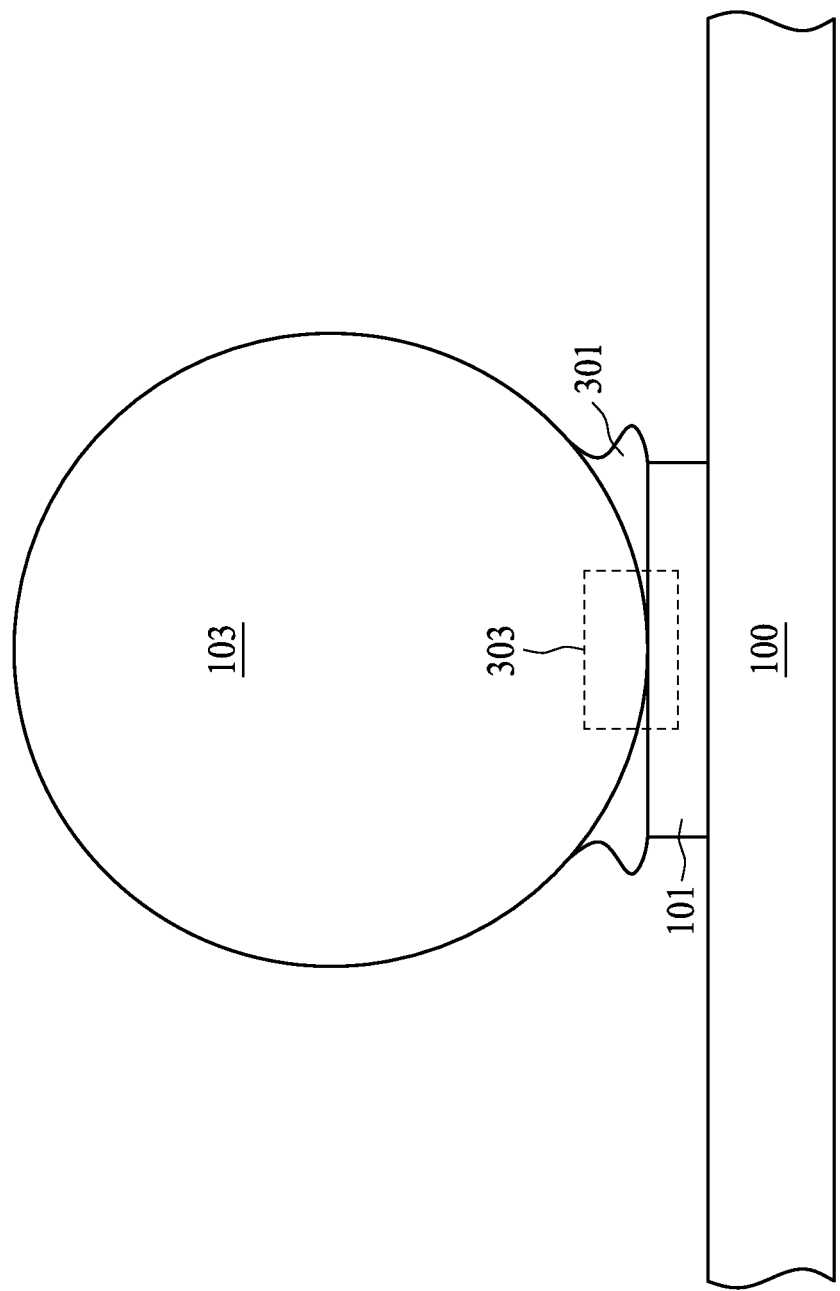

SEMICONDUCTOR PACKAGING AND MANUFACTURING METHOD THEREOF

FIELD

The present disclosure relates to a semiconductor packaging structure.

BACKGROUND

Semiconductor device performance improvements are largely achieved by reducing device dimensions, a development that has, at the same time, resulted in considerable increases in device density and device complexity. In a wafer level chip scale package (WLCSP) technology, the semiconductor chip is packaged directly on the wafer level after the semiconductor chips are finished completely on the wafer following by the separation of individual chip packages from the wafer. As a result, the size of the chip package is almost equal to the size of the original semiconductor chip. WLCSP has been widely used for mobile phone applications, such as analog, wireless connectivity, CMOS image sensors, and others. Especially, WLCSP is increasingly used to package wireless basebands or RF transceiver resulting in sizes larger than 5×5 $mm^2$. The key components of a WLCSP for flip-chip bonding are redistribution layer (RDL), under bump metallurgy (UBM), and bumps such as solder bumps or metal posts. Among which solder bumps are used to access the devices, also referred to as Input/Output (I/O) structures of the device.

This has led to new methods of packaging semiconductor devices whereby structures such as Ball Grid Array (BGA) devices and Column Grid Array (CGA) devices have been developed. A BGA includes an array of bumps of solder that are affixed to pins on the bottom of an integrated circuit (IC) package for electrically connecting the IC package to a printed circuit board (PCB). The IC package may then be placed on the PCB, which has copper conductive pads in a pattern that matches the array of solder bumps on the IC package. The solder bumps may be heated to cause the solder bumps to melt. When the solder cools and solidifies, the hardened solder mechanically attaches the IC package to the PCB.

BGA's are known with 40, 50 and 60 mil spacing. Due to the increased device miniaturization, the impact that device interconnects have on device performance and device cost has also become a larger factor in package development.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 7A to FIG. 7E are cross sectional views showing operations of manufacturing a semiconductor package according to some embodiments of the present disclosure.

DETAILED DESCRIPTION OF THE INVENTION

Figure 1:
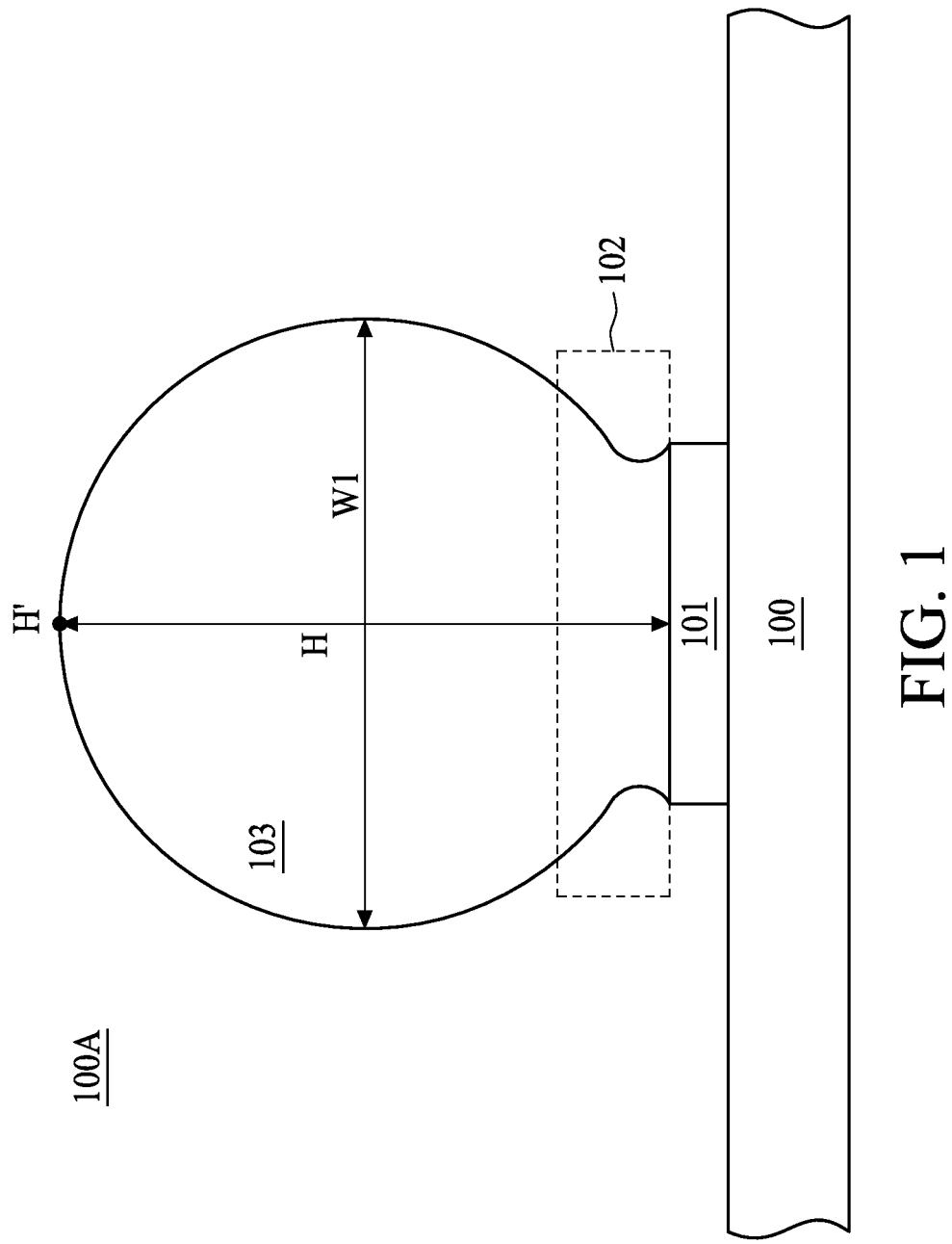
FIG. 1 is a cross sectional view of a portion of a semiconductor package according to some embodiments of the present disclosure.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features; the scope of the invention being defined by the claims appended hereto.

In the drawings, like reference numbers are used to designate like or similar elements throughout the various views, and illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

In order to ensure the package assembly area, some small WLP devices are integrated into one large size WLCSP which has more I/O pads. In larger size WLCSP, due to the difference in coefficient of thermal expansion (CTE) between the silicon die and PCB, more thermal stress is generated on the outermost solder joints. In addition, the solder bump pitch of WLCSP devices tends to decrease as well and thermal reliability is a great concern due to the smaller solder joint area. Considering all the factors listed above, a greater solder bump diameter is desired in order to achieve better reliability. However, utilizing larger solder bump in a fine pitch WLSCP results in bridge problem between the adjacent solder bumps. Bridge problem deteriorates the ball mount yield by generating electrically short connection.

Copper ball or copper core solder ball is a solution to solve the problem faced by Sn-containing solder ball. High cost and the unsatisfactory reliability property hinder the development of such technique. Plastic cored solder ball (a plastic core is covered by multilayer metal coating) is another solution for the above problems. The size-controllable and stress-absorbent flexible plastic core contributes to a better stand-off controllability and high reliability. However, the cost for the plastic cored solder ball limits its popularity to practical application of mass production.

The present disclosure provides a semiconductor package structure using Sn-containing solder ball, demonstrating high stand-off controllability, good electromigration resistance at solder joints, high ball mount yield, and low manufacturing cost in a fine pitch WLCSP. In some embodiments, the semiconductor package structure obtained using a manufacturing method described herein shows a solder bump with a junction portion in proximity to a contact pad supporting the solder bump, and the junction portion demonstrates an hourglass shape. The presence of the hourglass shape at the junction portion retains a high height to width ratio of the solder bump and achieves a better stand-off controllability. In some embodiments, good stand-off controllability prevents big volume solder bumps from bridge risk.

The present disclosure provides a method for manufacturing a semiconductor package containing solder bump structure described herein. A solder paste layer is formed on a contact pad prior to a disposition of a solder bump. The solder bump structure is subject to two temperature treatments. A first temperature treatment only permits the solder paste layer to liquefy and an electrical connection is formed between the solder bump and the contact pad. A second temperature treatment permits both the solder bump and the solder paste layer to liquefy and an electrical connection is formed between the solder bump and an external semiconductor device.

In describing and claiming the present disclosure, the following terminology will be used in accordance with the definitions set forth below.

As used herein, "flux" refers to substances facilitating soldering processes. In some embodiments, the flux contains reducing agent such as charcoal. In some embodiments, the flux contains corrosive materials. In some embodiments, the flux reduces surface tension of the molten solder and causes it to flow and wet a work piece more easily. In some embodiments, the flux is rosin-based. In some embodiments, the constituent components of the flux include rosin, a solvent, a thixotropic agent (sagging preventing agent), an activator, and an additive. The rosin can be natural rosin or a synthetic rosin such as polymerized rosin, disproportionated rosin, and hydrogenated rosin. Any of such rosins or a combination of a plurality thereof may be used. The solvent used in the flux is typically an alcohol of the so-called carbitol system or glycol system. Any of such alcohols or a combination of a plurality thereof may be used. An amide or caster wax can be used as the thixotropic agent. Other organic acids serving as activators may be used together with activators such as amine salts as the activator. Residue modifiers such as typical plasticizers and fillers may be used in combination as the additive.

In the present disclosure, "solder paste" refers to homogenous, stable suspensions of solder particles in a flux medium material. In some embodiments, the solder paste (typically also referred to as "solder cream" and "soldering paste") obtained by mixing (kneading) a solder alloy powder and a flux. Tin-lead systems have been conventionally used as solder alloys, but a transition to lead-free solders (containing no lead) has been made in recent years with consideration for hazardousness of lead. In some embodiments, lead-free solder alloy powder includes Sn, Ag, Bi, and In (particle size from about 20 μm to about 38 μm).

As used herein, "vapor deposition" refers to process of depositing materials on a substrate using a vapor phase of a material to be deposited or a precursor of the material. Vapor deposition processes include any process such as, but not limited to, chemical vapor deposition (CVD) and physical vapor deposition (PVD). Examples of vapor deposition methods include hot filament CVD, rf-CVD, laser CVD (LCVD), conformal diamond coating processes, metal-organic CVD (MOCVD), sputtering, thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like.

As used herein, "molding compound" refers to a compound formed with composite materials. A molding compound may include epoxy resins, phenolic hardeners, silicas, catalysts, pigments, mold release agents, or the like. Material for forming a molding compound has a high thermal conductivity, a low moisture absorption rate, a high flexural strength at board-mounting temperatures, or a combination thereof.

As used herein, "electrical interconnects" refers to conductive lines or films routed inside the IC structure over and around the die or dies. In some embodiments, the electrical interconnects are redistribution layers (RDL). The RDLs are used for a fan-in or a fan-out process. In some embodiments, the electrical interconnects are formed with a conductive material such as gold, silver, copper, nickel, tungsten, aluminum, and/or alloys thereof.

As used herein, a "contact pad" is disposed on a top surface of a die. A top surface of the contact pad may receive a solder bump or solder paste and acts as a terminal to connect the die to an external circuit or electrically connects to an RDL. A bottom surface of the contact pad is either connected to an interconnect, such as an RDL, or to an active area in the die. In some embodiments, the contact pad is an under bump metallization (UBM). In some embodiments, the UBM is formed with a conductive material such as gold, silver, copper, nickel, tungsten, aluminum, and/or alloys thereof.

As used herein, a "patterning" or "patterned" is used in the present disclosure to describe an operation of forming a predetermined pattern on a surface. The patterning operation includes various steps and processes and varies in accordance with features of embodiments. In some embodiments, a patterning operation patterns an existing film or layer. The patterning operation includes forming a mask on the existing film or layer and removing the unmasked portion of the film or layer with an etch or other removal process. The mask is a photo resist or a hardmask. In some embodiments, a patterning operation directly forms a patterned layer on a surface. The patterning operation includes forming a photosensitive film on the surface, conducting a photolithography process and a developing process. The remaining photosensitive film may be removed or retained and integrated into the package.

The problems and needs outlined above may be addressed by embodiments of the present disclosure. FIG. 1 is a cross sectional view of a portion of a semiconductor package 100A. A solder bump structure shown in FIG. 1 includes a carrier 100, a contact pad 101, and a solder bump 103 positioned on the contact pad 101. In some embodiments, the carrier 100 includes a silicon wafer, a silicon die, a semiconductor-on-insulator (SOI) substrate, any construction comprising semiconductor materials, or a PCB. Semiconductor devices, such as transistors, capacitors, resistors, diodes, photo-diodes, fuses, and the like, interconnected to perform one or more functions is formed at a surface of the carrier 100. In some embodiments, the solder bump 103 possesses a height H measured from a top H' of the solder bump 103 to the contact pad 101 along a vertical line. The solder bump 103 also possesses a width W1 that is measured as a widest dimension of the solder bump 103 in a direction perpendicular to the height H. In certain embodiments, the height H and the width W1 of the solder bump 103 is measured by a cross sectional scanning electron microscope (SEM) under a magnification of from about 300× to about 600×.

A junction portion 102 of the solder bump 103 refers to a neck structure contacting a top surface of the contact pad 101 at the bottom of the solder bump 103. In some embodiments, the junction portion 102 of the solder bump 103 manufactured according to a method disclosed herein possesses an hourglass shape. The junction portion 102 has a narrowest part, and a width of the other parts of the junction portion 102 increases when the width measurement moves from the narrowest part to the top H' of the solder bump 103 and to the contact pad 101.

Figure 2:
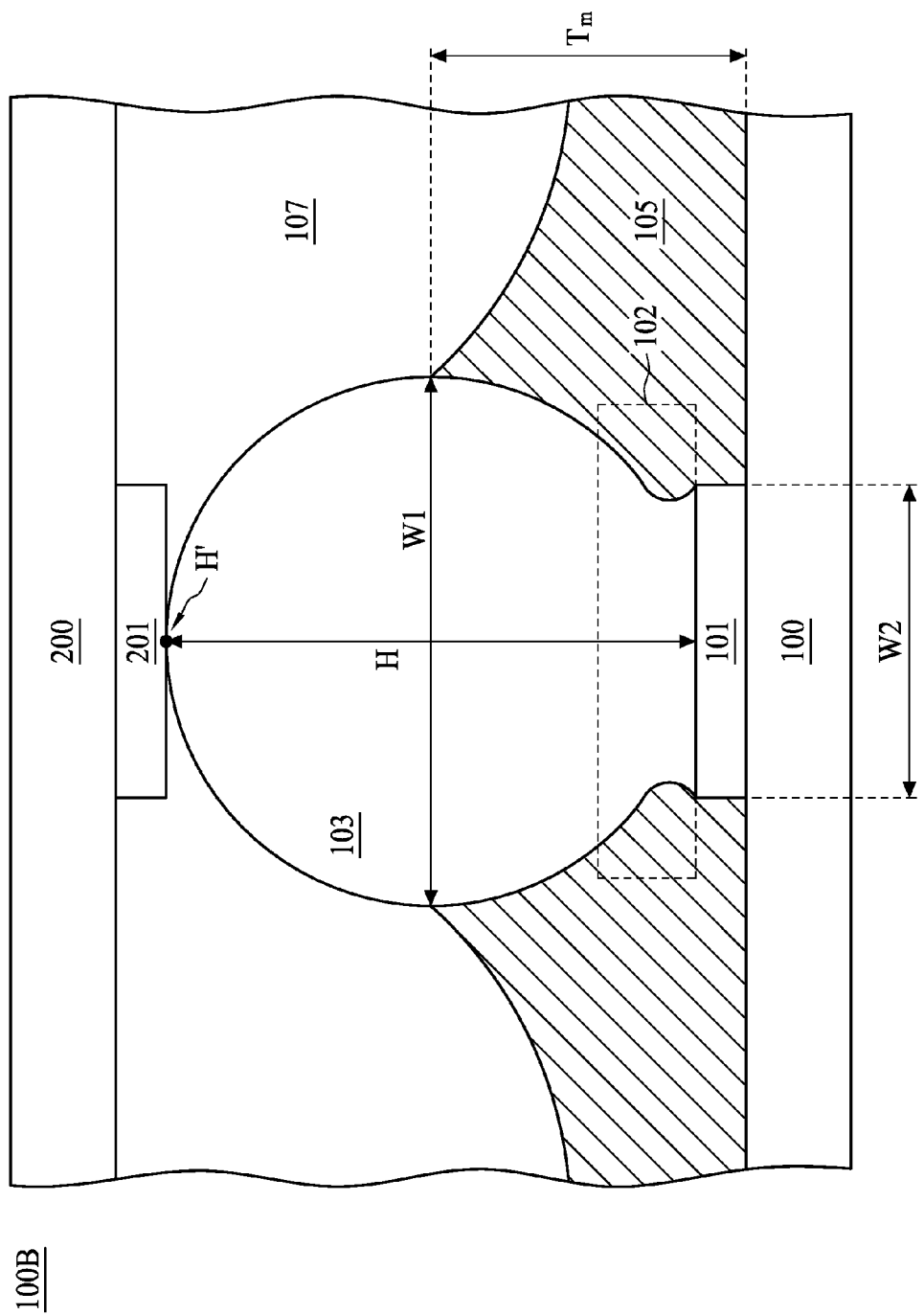
FIG. 2 is a cross sectional view of a portion of a semiconductor package according to some embodiments of the present disclosure.

Referring to FIG. 2, FIG. 2 is a cross sectional view of a portion of a semiconductor package 100B according to some embodiments of the present disclosure. Elements sharing the same labeling numerals as those in the FIG. 1 are referred thereto and are not repeated here for simplicity. The semiconductor package 100B includes a molding compound 105 surrounding the junction portion 102 and a lower portion of the solder bump 103. By stating the lower portion of the solder bump 103, one refers to a portion in proximity to the contact pad 101 on the carrier 100. In some embodiments, the junction portion 102 with the hourglass shape is close to the contact pad 101. However, in other embodiments, the junction portions 102 with the hourglass shape are formed both close to the bottom contact pad 101 and close to a top contact pad 201 (this configuration is not shown in FIG. 2).

In some embodiments, a thickness $T_m$ of the molding compound 105 is from about 0.4 times to about 0.6 times of the height H of the solder bump 103. In some embodiments, the semiconductor package 100B includes an underfill layer 107 surrounding an upper portion of the solder bump 103. By stating the upper portion of the solder bump 103, one refers to a portion in proximity to the top H' of the solder bump 103. In some embodiments, the upper portion of the solder bump 103 refers a portion of the solder bump 103 close to a conductive contact pad 201 that is connected to an external device 200. In certain embodiments, the external device 200 includes a silicon wafer, a silicon die, a semiconductor-on-insulator (SOI) substrate, any construction comprising semiconductor materials, or a PCB. Semiconductor devices, such as transistors, capacitors, resistors, diodes, photo-diodes, fuses, and the like, interconnected to perform one or more functions is formed at a surface of the external device 200. The semiconductor package 100B shown in FIG. 2 includes both the molding compound 105 and the underfill layer 107. The molding compound 105 surrounds the bottom contact pad 101, the junction portion 102, and the lower portion of the solder bump 103; while the underfill layer 107 surrounds the top conductive contact pad 201 and the upper portion of the solder bump 103.

In some embodiments, the solder bump 103 includes alloys composed of at least one of the following elements, tin (Sn), silver (Ag), copper (Cu), lead (Pb), bismuth (Bi), antimony (Sb), indium (In), germanium (Ge), nickel (Ni) and the arbitrary combinations thereof. In certain embodiments, the solder bump 103 comprises Sn, Ag, and Cu in appropriate chemical stoichiometric. The use of lead in solder bumps has come under scrutiny and has become undesirable for environmental and health reasons. As a result, attempts have been made to eliminate the requirement for lead from solder bumps. Such lead-free solder bumps typically include tin, copper and silver (typically 95.5% by weight tin, 4% by weight silver and 0.5% by weight copper). Bismuth may also be used together with tin, antimony and silver in a range of approximately 1.0% to 4.5% by weight.

In some embodiments, the junction portion 102 of the solder bump 103 includes Sn-containing (SnX) alloys which demonstrate an alloy melting point lower than 165 degrees Celsius. For example, the alloys at the junction portion 102 of the solder bump 103 includes binary Sn-containing (SnX) alloys such as $SnBi_x$, $SnSb_x$, $SnPo_x$, $SnGe_x$, $SnAl_x$, $SnGa_x$, $SnIn_x$, $SnTl_x$, BiInSn and the arbitrary combinations thereof. In other embodiments the alloys at the junction portion 102 of the solder bump 103 includes ternary or even quaternary alloys selected from the elements provided above. However, the Sn-containing (SnX) alloys are not limited to the elements provided in the present paragraph, any Sn-containing (SnX) alloys that possess a melting temperature lower than a melting temperature of a solder bump (normally within a range of from about 220 to about 250 degrees Celsius) can be detected at the junction portion 102 of the solder bump 103.

In some embodiments as shown in FIG. 2, the width W1 of the solder bump 103 is greater than a width W2 of the contact pad 101. For a fine pitch WLCSP, separation between adjacent contact pads decreases and so does the pitch between neighboring solder bumps. If the width W1 of the solder bump 103 with poor stand-off controllability is far greater than the underlying contact pad 101, the separation between adjacent contact pads is limited in order to avoid bridge defects between solder bumps. In some embodiments, the width W2 of the contact pad 101 is about 550 μm, and the width W1 of the solder bump 103 is about 288 μm. In those embodiments, a solder bump 103 with great stand-off controllability demonstrates a shear force of 440 gf in a ball shear test and meets the target ball shear specification of 250 gf.

Figure 3:
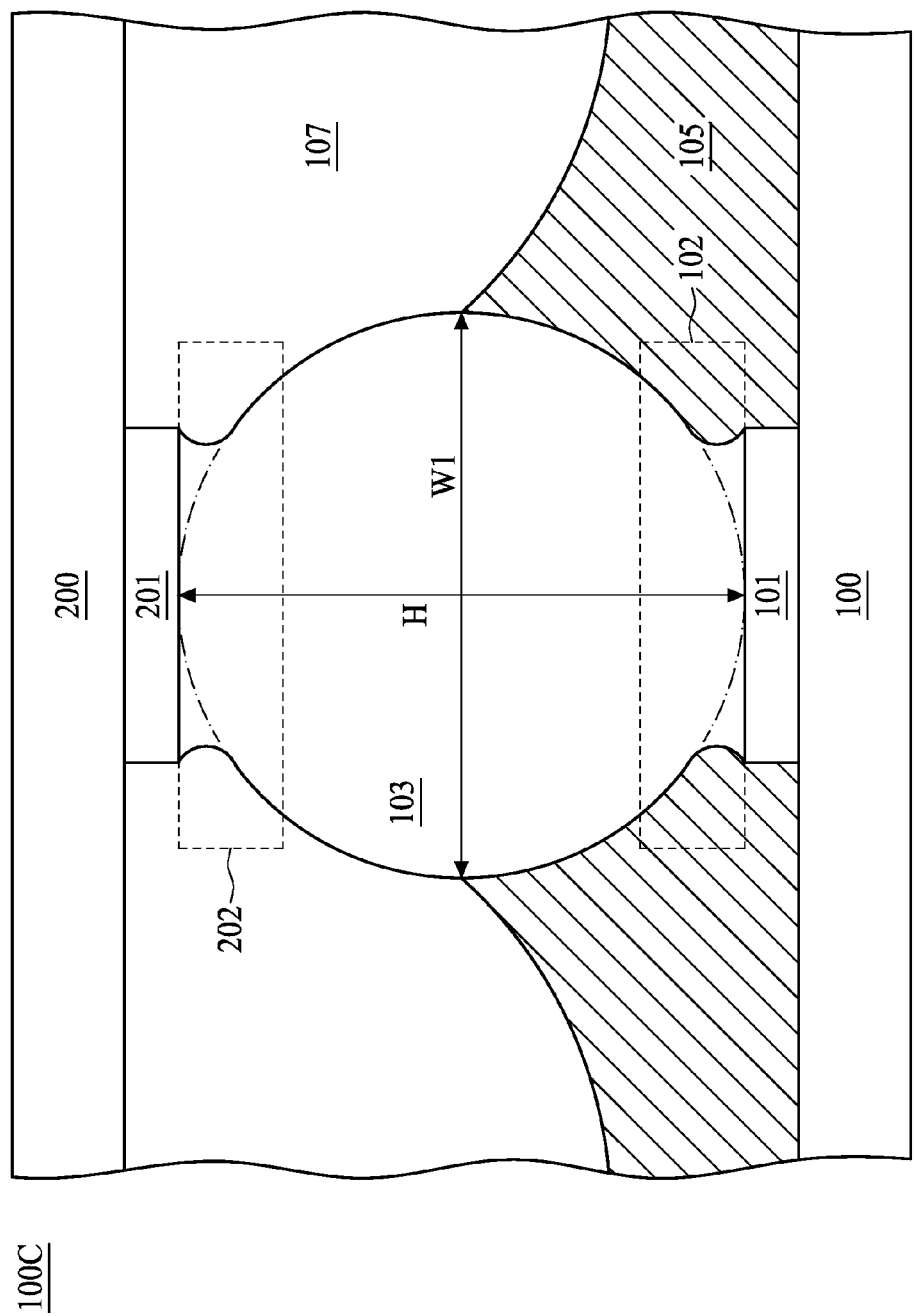
FIG. 3 is a cross sectional view of a portion of a semiconductor package according to some embodiments of the present disclosure.

Referring to FIG. 2 and FIG. 3, FIG. 3 is a cross sectional view of a portion of a semiconductor package 100C according to some embodiments of the present disclosure. Elements sharing the same labeling numerals as those in the FIG. 2 are referred thereto and are not repeated here for simplicity. In FIG. 3, the bottom junction portion 102 and the top junction portion 202 are shown to have an hourglass shape respectively. In this case, the molding compound 105 surrounds the bottom contact pad 101, the bottom junction portion 102, and the lower portion of the solder bump 103; while the underfill layer 107 surrounds the top conductive contact pad 201, the top junction portion 202, and the upper portion of the solder bump 103. In some embodiments, the upper and the lower portion of the solder bump 103 are encapsulated by different materials. However, a junction portion presenting either at an end closer to the contact pad 101 or at an end closer to the conductive contact pad 201 are both within the contemplated scope of the present disclosure.

In FIG. 3, the solder bump 103 possesses a height H and a width W1. In some embodiments, the height to the width ratio (H/W1) of the solder bump 103 is about from 0.85 to about 1.15. Note the height to the width ratio (H/W1) of the solder bump 103 in the present disclosure is close to 1, which represent a (H/W1) ratio of a solder bump prior to the mounting on a contact pad. As shown in FIG. 3, the height H of the solder bump 103 is a length measured from the bottom contact pad 101 to the top conductive contact pad 201. In some embodiments, the height H of the solder bump 103 is about 290 μm, and the width of such solder bump 103 is about 280 μm, and hence a height to width ratio (H/W1) of 1.04 is obtained. In other embodiments, the height H of the solder bump 103 is about 244 μm, and the width of such solder bump 103 is about 288 μm, and hence a height to width ratio (H/W1) of 0.85 is obtained.

Figure 4:
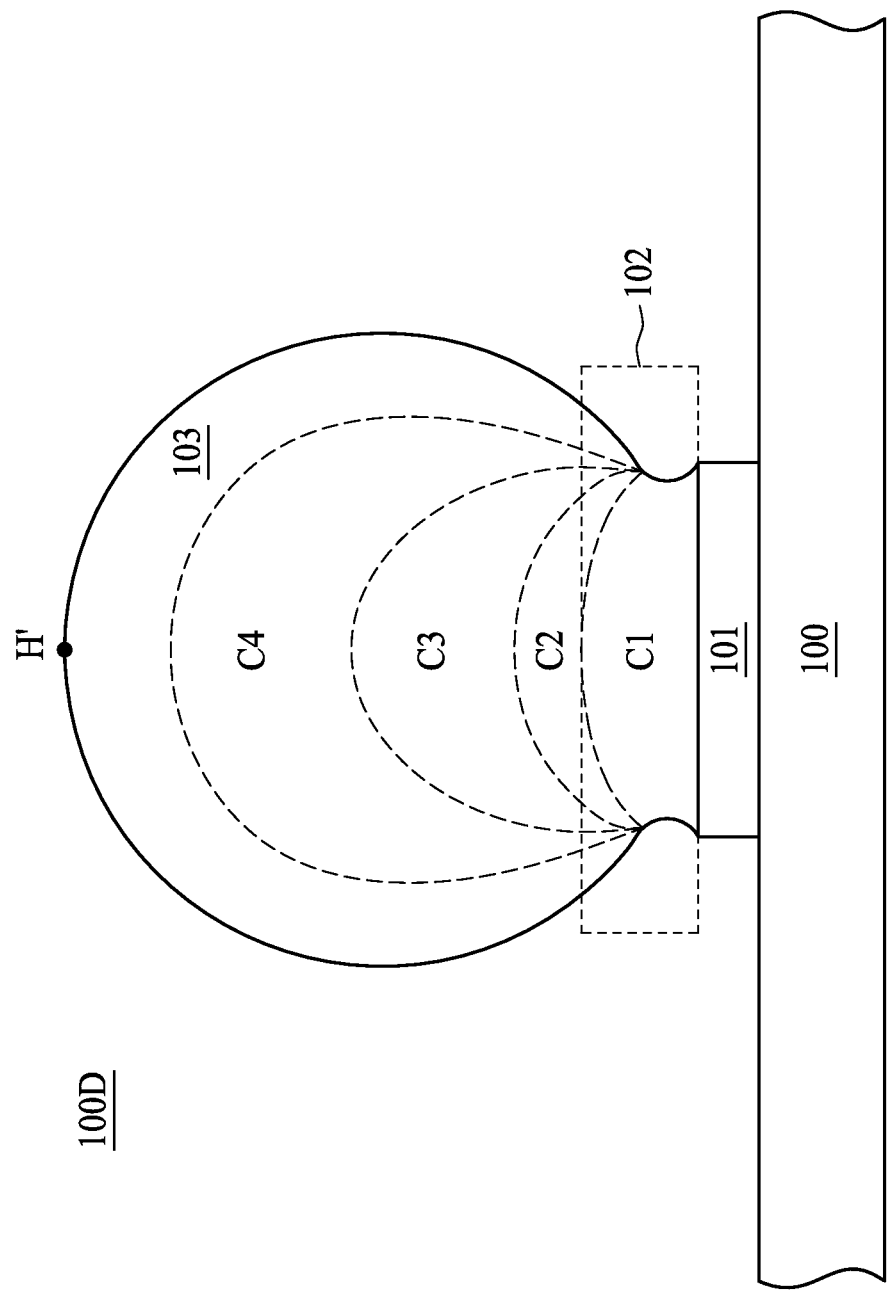
FIG. 4 is a cross sectional view of a portion of a semiconductor package according to some embodiments of the present disclosure, showing a concentration contour of an element in the semiconductor package.

Referring to FIG. 4, FIG. 4 is a cross sectional view of a portion of a semiconductor package 100D according to some embodiments of the present disclosure. The X component in the Sn-containing (SnX) alloys at the junction portion 102 of the solder bump 103 shows a concentration distribution in the solder bump 103 as a result of diffusion or convection. The X component in the Sn-containing (SnX) alloys is previously described in the present disclosure and will not be repeated here for simplicity. FIG. 4 is one of the concentration distributions of the X component in the solder bump 103 by showing four equi-concentration contours C1, C2, C3, and C4 threin. In some embodiments, the order of the X component concentration from high to low is: C1>C2>C3>C4, that is, the X component concentration decreases from the junction portion 102 to the top H' of the solder bump 103. In other embodiments, the topologies of the equi-concentration contours are not necessary to be as those shown in FIG. 4. However, the X component concentration possesses a concentration gradient pointing from a lower concentration region (close to the top and/or the peripheral of the solder bump 103) to a higher concentration region (close to the junction portion 102 of the solder bump 103). In some embodiments, having X component distributed in the solder bump 103 contributes to better electromigration and robust thermal cycle properties compared to the case where no X component is present in the solder bump 103.

Figure 5:
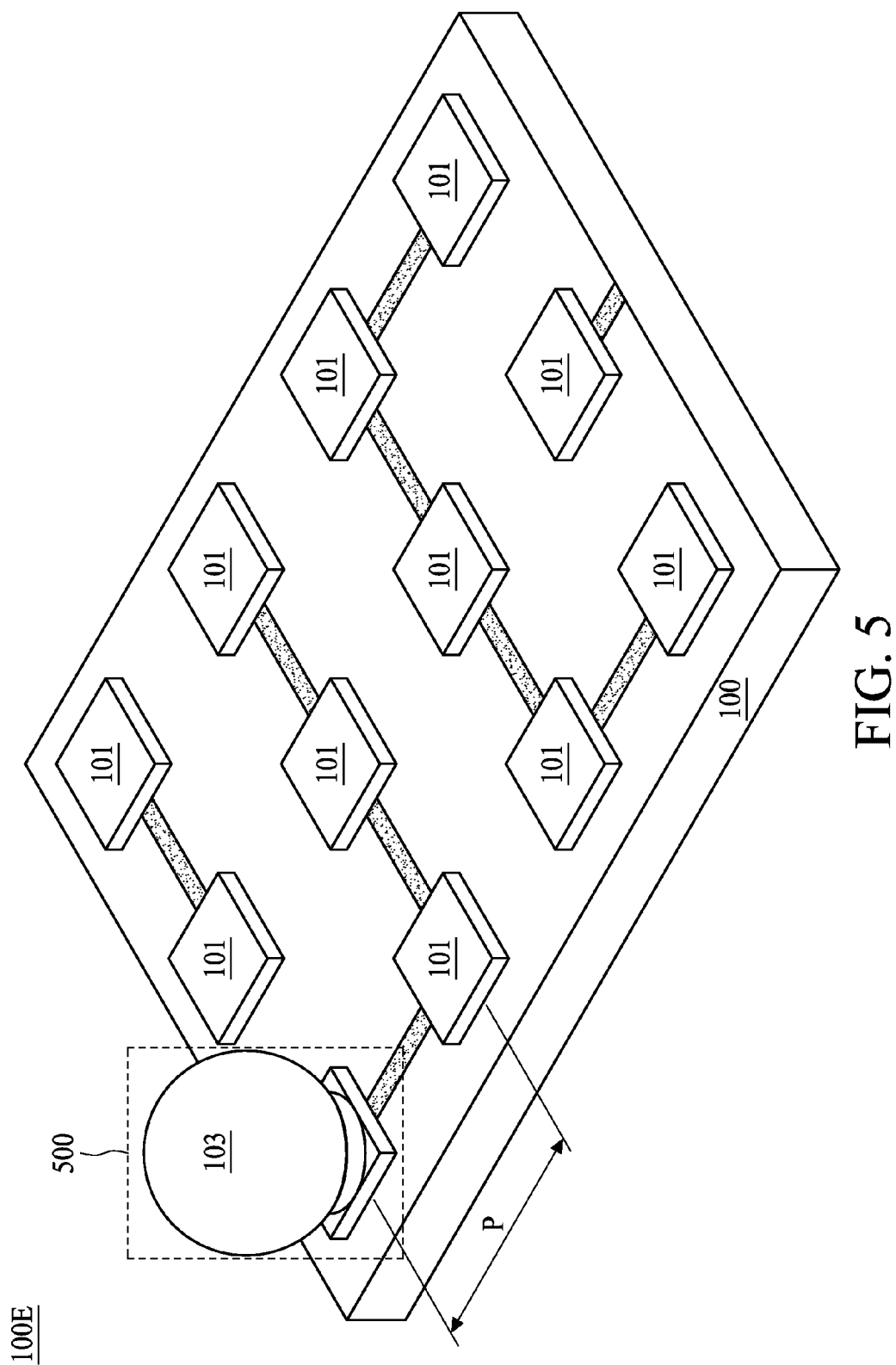
FIG. 5 is a perspective view of a ball grid array (BGA) of a semiconductor package according to some embodiments of the present disclosure.

FIG. 5 shows a portion of a semiconductor package 100E with BGA. For simplicity, only one solder bump 103 is positioned on the contact pad 101. In some embodiments, one solder bump is positioned on each of the contact pad 101 in the BGA. Note that each of the solder bumps in the BGA includes a structure previously discussed in the present disclosure referring to FIG. 1. Separation between respective centers of two adjacent contact pads 101 is a pitch P, and in some embodiments, the finest pitch P is less than 0.2 mm. People having ordinary skill in the art shall understand that pitches with different scales are simultaneously present in the BGA and is thus within the contemplated scoped of the present disclosure. A circuit board (not shown) with several conductive contact pads is further mounted on the BGA. Each conductive contact pad is corresponding to a contact pad 101 on the BGA. The conductive contact pad is connected with the contact pad 101 through a solder bump 103.

Figure 6:
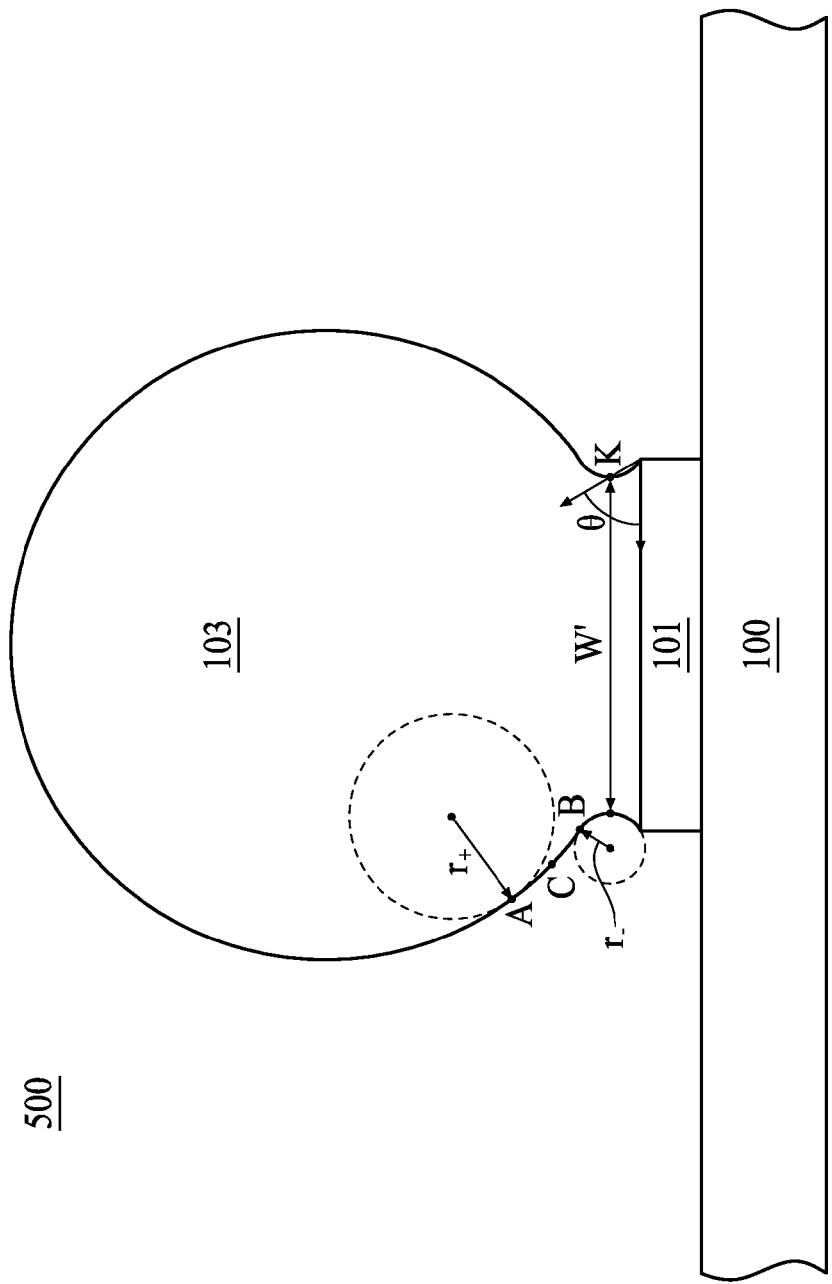
FIG. 6 is a cross sectional view of a portion of a semiconductor package according to some embodiments of the present disclosure.

FIG. 6 is an enlarged cross sectional view of a portion 500 of the BGA 100E shown in FIG. 5. In FIG. 6, the cross section of the solder bump 103 includes a point where a curvature thereof is zero. A positive radius of curvature $r_+$ is identified at point A on a peripheral of the solder bump 103, while a negative radius of curvature $r_-$ is identified at point B on a peripheral of the solder bump 103. In the present disclosure, a radius of curvature inside the solder bump 103 has a positive sign, and a radius of curvature outside the solder bump 103 has a negative sign. Because a peripheral contour of the solder bump 103 is continuous without abrupt turning points, a point C between point A (positive curvature) and point B (negative curvature) can be identified to have a zero curvature. In some embodiments of the present disclosure, the junction portions 102 shown in FIG. 1 to FIG. 4 possess an hourglass shape, and hence a zero curvature point can be identified within the junction portion 102. Also shown in FIG. 6, a narrowest width W' at the junction portion of the solder bump 103 can be identified. The junction portion described herein can be referred to the junction portion 102 previously described in FIG. 1 to FIG. 4. On a same horizontal line, the narrowest width W' corresponds to a point K on a contour of the junction portion. In some embodiments, an angle θ formed between the contact pad 101 and the point K is an acute angle. In other embodiments, the angle θ formed between the contact pad 101 and the point K is less than 90 degrees.

Figure 7A:
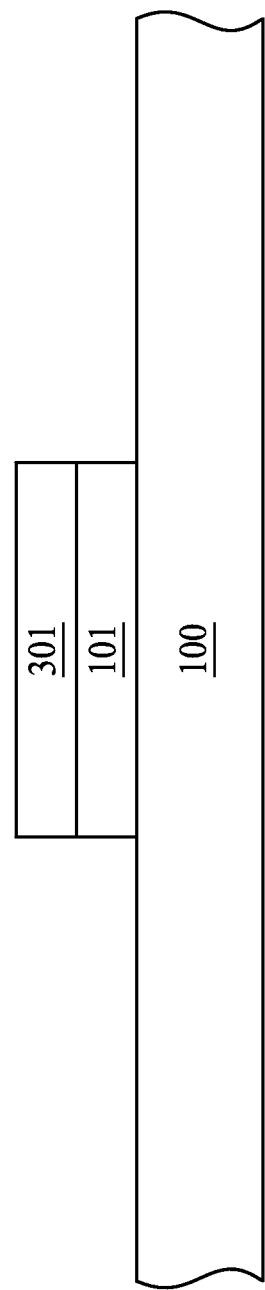

FIG. 7A to FIG. 7E show operations in a method for manufacturing a semiconductor package. Elements sharing the same labeling numerals as those in the FIG. 1 and FIG. 2 are referred thereto and are not repeated here for simplicity. In FIG. 7A, a solder paste layer 301 is formed on a contact pad 101. Solder pastes layer are homogenous, stable suspensions of solder particles in a flux medium material, and in some embodiments, the solder paste layer is applied by a method such as screen or stencil printing or dispensing. In some embodiments, preparing solder pastes includes blending any of the following solder particles in a rosin-based flux medium. For example, the solder particles includes, but not limited to, $SnBi_x$, $SnSb_x$, $SnPb_x$, $SnGe_x$, $SnAl_x$, $SnGa_x$, $SnIn_x$, $SnTl_x$, and the arbitrary combinations thereof. However, the solder particles are not limited to the elements provided in the present paragraph, any Sn-containing solder particles that possess a melting temperature lower than a melting temperature of a solder ball subsequently applied thereon is applicable in the present disclosure.

Figure 7B:
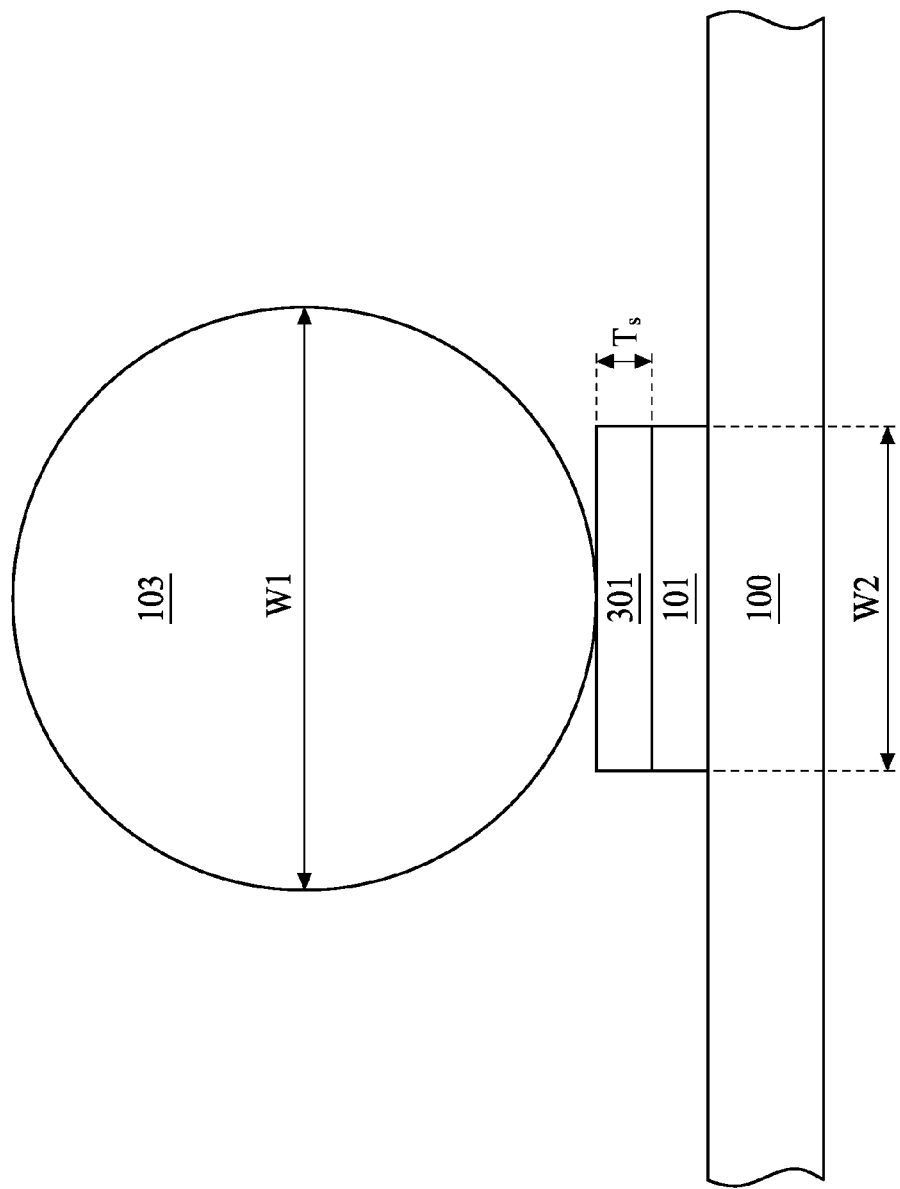

In FIG. 7B, a solder bump 103 is positioned on the solder paste layer 301 by ball-dropping or stencil dispensing. In some embodiments, the width W1 of the solder bump 103 and a thickness $T_s$ of the solder paste layer 301 is controlled to be within a ratio (W1/$T_s$) of from about 2 to about 5. In the case where the ratio (W1/$T_s$) is lower than 2, the junction portion of the solder bump in a final product does not possess an hourglass shape. As shown in FIG. 7B, a width W2 of the contact pad 101 is controlled to be smaller than the width W1 of the solder bump 103.

In FIG. 7C, a first electrical connection 303 between the solder bump 103 and the contact pad 101 is formed by liquefying the solder paste layer 301. Since the solder paste layer 301 is transformed to a molten state, the gravity causes the solder bump 103 to subside into the solder paste layer 301 and physically connecting to the contact pad 101. In some embodiments, forming the first electrical connection 303 includes heating the solder paste layer 301 to a first temperature by an infrared lamp, a hot air pencil, heated conveyor belt, or, more commonly, by passing it through a carefully controlled oven. Note the first temperature is controlled to be lower than a melting temperature of the solder bump 103 and higher than the melting temperature of the solder paste layer 301. In some embodiments, the first temperature is lower than about 170 degrees Celsius, for example, about 165 degrees Celsius. Because the melting point of a $SnBi_x$ solder paste layer is about 140 degrees Celsius and the melting point of a Sn—Ag—Cu (SAC) solder ball is about 217 degrees Celsius, the first temperature of about 165 degrees Celsius causes the $SnBi_x$ solder paste layer to liquefy but not the SAC solder ball.

Figure 7D:
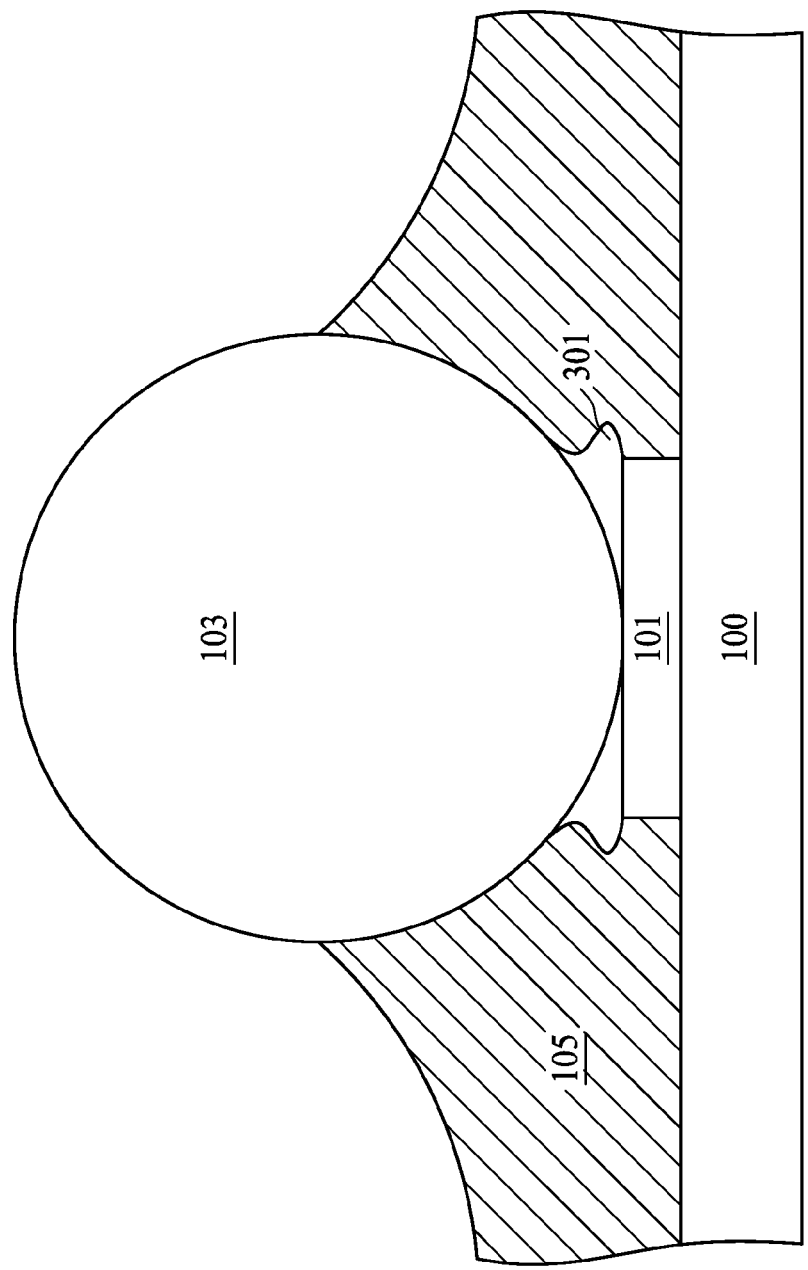

Referring to FIG. 7D, a lower portion of the solder bump 103 is encapsulated by, for example, a liquid molding compound 105. Discussion regarding the lower portion of the solder bump 103 is referred to the FIG. 2 of the present disclosure and is not repeated here for simplicity. In some embodiments, a die saw operation is conducted after the encapsulation of the solder bump 103. Die containing desirable numbers of the I/O pins (i.e. solder bumps) are singulated and to be bonded to an external device (not shown).

Figure 7E:
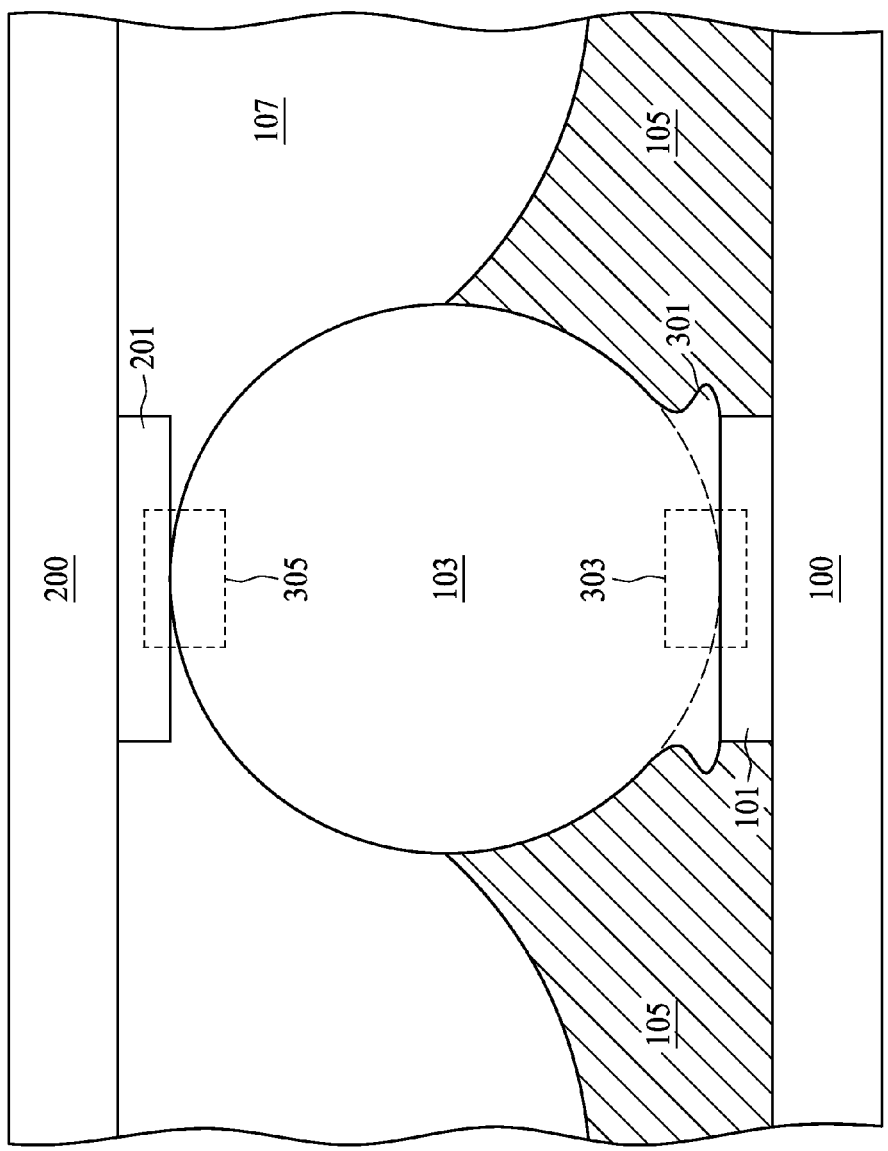

Referring to FIG. 7E, a second electrical connection 305 between the solder bump 103 and an external device 200 is formed by liquefying both the solder paste layer 301 and the solder bump 103. In some embodiments, forming the second electrical connection 305 includes heating the solder bump 103 and the solder paste layer 301 to a second temperature by an infrared lamp, a hotuse the melting point of a $SnBi_x$ solder paste layer is about 140 degrees Celsius and the melti air pencil, heated conveyor belt, or, more commonly, by passing it through a carefully controlled oven. Note the second temperature is controlled to be greater than the melting temperature of the solder bump 103 the melting temperature of the solder paste layer 301. In some embodiments, the second temperature is about 50 degrees Celsius greater than the first temperature. Because the melting point of a Sn—Ag—Cu (SAC) solder ball is about 217 degrees Celsius, the second temperature of from about 240 to about 260 degrees Celsius causes both the $SnBi_x$ solder paste layer and the SAC solder ball to liquefy, forming a second electrical connection 305 between the solder bump 103 and a conductive contact pad 201 of the external device 200.

As shown in FIG. 7E, an undrefill layer 107 is formed surrounding an upper portion of the solder bump 103 according to some embodiments of the present disclosure. Discussion regarding the upper portion of the solder bump 103 is referred to the FIG. 2 of the present disclosure and is not repeated here for simplicity.

Some embodiments of the present disclosure provide a semiconductor package includes a contact pad, a device external to the contact pad and a solder bump on the contact pad. The device has a conductive contact pad corresponding to the contact pad. The solder bump connects the contact pad with the conductive contact pad. The solder bump comprises a height from a top of the solder bump to the contact pad; and a width which is a widest dimension of the solder bump in a direction perpendicular to the height. A junction portion of the solder bump in proximity to the contact pad comprises an hourglass shape.

In some embodiments of the present disclosure, the semiconductor package further includes a molding compound surrounding the junction portion and a lower portion of the solder bump. A thickness of the molding compound is from about 0.4 times to about 0.6 times of the height of the solder bump, and the lower portion of the solder bump is in proximity to the contact pad.

In some embodiments of the present disclosure, the semiconductor package further includes an underfill layer surrounding an upper portion of the solder bump. The upper portion of the solder bump is in proximity to the top of the solder bump.

In some embodiments of the present disclosure, the height to the width ratio of the solder bump in the semiconductor package is about from 0.85 to about 1.15

In some embodiments of the present disclosure, the junction portion of the solder bump includes SnX alloys having an alloy melting temperature lower than 165 degrees Celsius.

In some embodiments of the present disclosure, the X in the SnX alloys includes Bi, Sb, Po, Ge, Al, Ga, In, Tl, and the arbitrary combination thereof.

In some embodiments of the present disclosure, concentration of X decreases from the junction portion of the solder bump to the top of the solder bump.

In some embodiments of the present disclosure, the width of the solder bump is greater than a width of the contact pad.

In some embodiments of the present disclosure, the solder bump includes Sn, Ag, Cu, Pb, Ni, Ge, Bi and the arbitrary combination thereof.

In some embodiments, a semiconductor package includes a ball grid array (BGA) includes a plurality of contact pads, wherein each of the plurality of contact pads is connected with a solder bump at one end of the solder bump. A finest pitch in the BGA is less than about 0.2 mm. The semiconductor package includes a circuit board including a plurality of conductive contact pads, wherein each of the plurality of conductive contact pads is electrically connected with the BGA at the other end of the solder bump. The solder bump includes a height (H) from a top of the solder bump to the contact pad; and a width (W1) which is a widest dimension of the solder bump in a direction perpendicular to the height. The solder bump has a junction portion of the solder bump in proximity to the contact pad comprises an hourglass shape.

Some embodiments of the present disclosure provide a semiconductor package, including a ball grid array (BGA), each solder bump in the BGA has a structure includes a contact pad and a solder bump on the contact pad. The solder bump comprises a height from a top of the solder bump to the contact pad; and a width which is a widest dimension of the solder bump in a direction perpendicular to the height. A junction portion of the solder bump in proximity to the contact pad comprises an hourglass shape. A finest pitch in the BGA is less than 0.2 mm.

In some embodiments of the present disclosure, each solder bump in the BGA has a zero curvature.

Some embodiments of the present disclosure provide a method of manufacturing a semiconductor package. The method includes forming a solder paste layer on a contact pad; positioning a solder bump on the solder paste layer; forming a first electrical connection between the solder bump and the contact pad; encapsulating the solder paste layer and a lower portion of the solder bump, wherein the lower portion of the solder bump is in proximity to the contact pad; and forming a second electrical connection between the solder bump and an external device.

In some embodiments of the present disclosure, the method of manufacturing a semiconductor package further includes forming an underfill layer surrounding an upper portion of the solder bump. The upper portion of the solder bump is in proximity to the external device.

In some embodiments of the present disclosure, the forming the first electrical connection between the solder bump and the contact pad in the method of manufacturing the semiconductor package includes heating the solder paste layer to a first temperature.

In some embodiments of the present disclosure, a melting point of the solder paste is lower than the first temperature, and the first temperature is lower than a melting point of the solder bump.

In some embodiments of the present disclosure, the first temperature is lower than 170 degrees Celsius.

In some embodiments of the present disclosure, the forming the second electrical connection between the solder bump and the external device in the method of manufacturing the semiconductor package includes heating the solder paste layer and the solder bump to a second temperature.

In some embodiments of the present disclosure, a melting point of the solder paste is lower than a melting point of the solder bump, and the melting point of the solder bump is lower than the second temperature.

In some embodiments of the present disclosure, the second temperature is at least 50 degrees Celsius greater than the first temperature.

In some embodiments of the present disclosure, the forming the solder paste layer on the contact pad in the method of manufacturing the semiconductor package includes forming the solder paste with a thickness of T, and the positioning the solder bump on the solder paste layer in the method of manufacturing the semiconductor package includes positioning the solder bump with a width of W. The width W is a widest dimension of the solder bump in a horizontal direction, and a W/T ratio is of from about 2 to about 5.

Although the present invention and its advantages have been described in detail, it should be understood that various changes, substitutions and alterations cancan be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor package, comprising:
    forming a solder paste layer on a contact pad;
    positioning a solder bump on the solder paste layer;
    forming a first electrical connection between the solder bump and the contact pad;
    encapsulating the solder paste layer and a lower portion of the solder bump, wherein the lower portion of the solder bump is in proximity to the contact pad;
    forming a second electrical connection between the solder bump and an external device; and
    forming an underfill layer surrounding and in contact with an upper portion of the solder bump, wherein the upper portion of the solder bump is in proximity to the external device.

2. The method of manufacturing a semiconductor package in claim 1, wherein the forming the first electrical connection between the solder bump and the contact pad comprises heating the solder paste layer to a first temperature.

3. The method of manufacturing a semiconductor package in claim 2, wherein a melting point of the solder paste is lower than the first temperature, and wherein the first temperature is lower than a melting point of the solder bump.

4. The method of manufacturing a semiconductor package in claim 3, wherein the first temperature is lower than 170 degrees Celsius.

5. The method of manufacturing a semiconductor package in claim 1, wherein the forming the second electrical connection between the solder bump and the external device comprises heating the solder paste layer and the solder bump to a second temperature.

6. The method of manufacturing a semiconductor package in claim 5, wherein a melting point of the solder paste is lower than a melting point of the solder bump, and wherein the melting point of the solder bump is lower than the second temperature.

7. The method of manufacturing a semiconductor package in claim 6, wherein the second temperature is at least 50 degrees Celsius greater than the first temperature.

8. The method of manufacturing a semiconductor package in claim 1, wherein
    the forming the solder paste layer on the contact pad comprises forming the solder paste with a thickness of T, and
    the positioning the solder bump on the solder paste layer comprises positioning the solder bump with a width of W, wherein the width W is a widest dimension of the solder bump in a horizontal direction, and
    wherein a W/T ratio is of from about 2 to about 5.

9. A method of manufacturing a semiconductor package, comprising:
    forming a solder paste layer on a contact pad;
    positioning a solder bump on the solder paste layer;
    forming a first electrical connection between the solder bump and the contact pad;
    encapsulating the solder paste layer and a lower portion of the solder bump with an encapsulant while keeping an upper portion of the solder bump being free from the encapsulant; and
    forming a second electrical connection between the solder bump and an external device,
    wherein the lower portion of the solder bump is in proximity to the contact pad.

10. The method of manufacturing a semiconductor package in claim 9, wherein the forming the solder paste layer comprises blending Sn-containing solder particles in a rosin-based flux medium, wherein a melting temperature of the Sn-containing solder particles is lower than a melting temperature of the solder bump.

11. The method of manufacturing a semiconductor package in claim 10, wherein the Sn-containing solder particles comprise $SnBi_x$, $SnSb_x$, $SnPb_x$, $SnGe_x$, $SnAl_x$, $SnGa_x$, $SnIn_x$, $SnTl_x$, or an arbitrary combinations thereof.

12. The method of manufacturing a semiconductor package in claim 9, wherein the forming the first electrical connection comprises heating the solder paste layer to a first temperature lower than 170 degrees Celsius by an infrared lamp, a hot air pencil, a heated conveyor belt, or an oven.

13. The method of manufacturing a semiconductor package in claim 12, wherein the first temperature is greater than a melting point of the solder paste layer and lower than a melting point of the solder bump.

14. The method of manufacturing a semiconductor package in claim 9, wherein the forming the second electrical connection comprises heating the solder paste layer and the solder bump to a second temperature in a range of from about 240 to about 260 degrees Celsius by an infrared lamp, a hot air pencil, a heated conveyor belt, or an oven.

15. The method of manufacturing a semiconductor package in claim 14, wherein the melting point of the solder bump and the melting point of the solder paste layer are lower than the second temperature.

16. The method of manufacturing a semiconductor package in claim 14, wherein the encapsulating the solder paste layer and a lower portion of the solder bump is conducted after heating the solder paste layer to the first temperature and before heating the solder paste layer to the second temperature.

17. The method of manufacturing a semiconductor package in claim 16, wherein the encapsulating the solder paste layer and a lower portion of the solder bump comprises forming a liquid molding compound.

18. The method of manufacturing a semiconductor package in claim 14, further comprising forming an underfill layer surrounding an upper portion of the solder bump after heating the solder paste layer and the solder bump to the second temperature, wherein the upper portion of the solder bump is in proximity to the external device.

19. The method of manufacturing a semiconductor package in claim 9, wherein forming the solder paste layer and positioning the solder bump comprise forming the solder paste layer with a thickness of from about 0.4 times to about 0.6 times of a height of the solder bump.

20. A method of manufacturing a semiconductor package, comprising:
- providing a substrate with a solder paste layer;
- positioning a solder bump on a solder paste layer;
- heating the solder ball and the solder paste layer to a first temperature;
- encapsulating the solder paste layer and a lower portion of the solder bump with an encapsulant while an upper portion of the solder bump being free from the encapsulant, wherein the lower portion of the solder bump is in proximity to the substrate; and
- heating the solder ball and the solder paste layer to a second temperature, wherein the second temperature is greater than the first temperature.

* * * * *